(12) United States Patent
Seams et al.

(10) Patent No.: US 7,352,444 B1
(45) Date of Patent: Apr. 1, 2008

(54) METHOD FOR ARRANGING AND ROTATING A SEMICONDUCTOR WAFER WITHIN A PHOTOLITHOGRAPHY TOOL PRIOR TO EXPOSING THE WAFER

(75) Inventors: Christopher A. Seams, Pleasanton, CA (US); Yonghong Yang, Eden Prairie, MN (US); Clifford P. Sandstrom, Lakeville, MN (US); Prakash R. Krishanan, Milpitas, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 54 days.

(21) Appl. No.: 11/158,513

(22) Filed: Jun. 22, 2005

Related U.S. Application Data

(60) Provisional application No. 60/582,601, filed on Jun. 24, 2004.

(51) Int. Cl.
*G03B 27/32* (2006.01)
(52) U.S. Cl. .......................... 355/77; 356/401
(58) Field of Classification Search ................ 355/53, 355/55, 67, 27; 396/611; 118/54
See application file for complete search history.

(56) References Cited

U.S. PATENT DOCUMENTS 5,760,881 A * 6/1998 Miyazaki et al. ............. 355/71
6,519,036 B1 * 2/2003 Hickman .................... 356/399
6,906,303 B1 * 6/2005 Smith ...................... 250/208.1
7,009,683 B2 * 3/2006 Sato ............................ 355/53

\* cited by examiner

*Primary Examiner*—Alan A. Mathews
*Assistant Examiner*—Chia-how Michael Liu
(74) *Attorney, Agent, or Firm*—Kevin L. Daffer; Mollie E. Lettang; Daffer McDaniel, LLP

(57) ABSTRACT

A method for arranging a semiconductor wafer within a photolithography tool and methods for processing a semiconductor wafer employing such an arrangement process are provided. The arrangement process includes positioning a semiconductor wafer on a stage in a pre-alignment unit of a photolithography tool such that a crystal orientation marker of the wafer is located at a first radial position. Thereafter, the wafer is moved to an exposure unit of the photolithography tool. During one or both of such steps, the semiconductor wafer is rotated such that the crystal orientation marker is relocated to a second, distinct radial position prior to arranging the wafer upon a stage of the exposure unit. In particular, the semiconductor wafer is rotated greater than approximately 10° and less than approximately 170° relative to the first radial position. The arrangement process is performed for lithography processes conducted during fabrication of a semiconductor device.

11 Claims, 1 Drawing Sheet

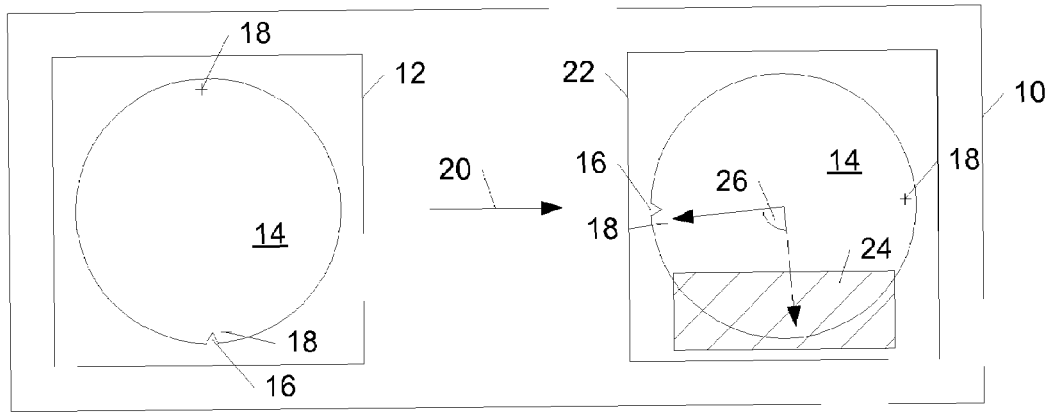

Printing alignment marks at positions within the semiconductor wafer relative to a crystal orientation marker of the semiconductor wafer and corresponding to respective positions of shadow clamps within a deposition chamber used to process the semiconductor wafer
30

↓

Positioning the semiconductor wafer within the deposition chamber such that the alignment marks are aligned with the shadow clamps
32

↓

Transferring the semiconductor wafer to a pre-alignment unit of a photolithography tool subsequent to the deposition of a material on the wafer
34

↓

Rotating the semiconductor wafer with respect to its position in the pre-alignment unit prior to arranging the semiconductor wafer upon a stage of an exposure unit of the photolithography tool
36

↓

Repeating the step of rotating the semiconductor wafer during subsequent lithography process steps
38

FIG. 2

METHOD FOR ARRANGING AND ROTATING A SEMICONDUCTOR WAFER WITHIN A PHOTOLITHOGRAPHY TOOL PRIOR TO EXPOSING THE WAFER

PRIORITY APPLICATION

The present application claims priority to provisional application No. 60/582,601 entitled "A Method of Aligning Wafers Using Bottom Alignment Marks" filed Jun. 24, 2004.

BACKGROUND OF THE INVENTION

1. Field of the Invention

The present invention relates generally to methods of semiconductor wafer fabrication, and more particularly, to a method of arranging a semiconductor wafer within a photolithography tool.

2. Description of the Related Art

The following descriptions and examples are given as background information only.

A technique known as "photolithography" or simply "lithography" is often used to pattern the various levels of an integrated circuit. In general, photolithography entails transferring an optical image from a patterned mask plate (i.e., a reticle) to a photosensitive film (i.e., a photoresist) formed upon a substrate. In particular, radiation is transmitted through transparent portions of the mask plate to alter the photochemical reaction of exposed regions of the photoresist and a solvent is used to remove the areas of higher solubility within the resist. The resulting patterned resist film serves to protect underlying conductive and/or dielectric materials within a semiconductor topography from subsequent etching and/or ion implantation processes. A typical process flow for manufacturing a semiconductor device includes twenty or more lithography steps. Thus, lithography processes and tools have been a focus for continuing the reduction of feature sizes within the semiconductor fabrication industry.

Alignment of successive layers in an integrated circuit is important to ensure proper operation of the circuit. As such, a patterned mask plate must be properly aligned to previously formed features in a semiconductor topography during a lithography process in order to avoid operational malfunctions, such as but not limited to shorting between structures that should be isolated from each other and/or shorting between isolation of structures that should be coupled to each other. Typically, an alignment system is used within a photolithography tool to align the mask plate to the semiconductor topography. The alignment system may employ alignment marks formed in the substrate (e.g., trenches in the form of a geometric shape, such as a square, a "+" or an "X") as reference points to align the mask plate to the semiconductor topography. One technique of aligning a reticle to a wafer includes propagating a light beam through a projection lens of the system to locate alignment marks. Such an approach is often referred to as "through the lens" or "on-axis." In most cases, the light beam in an on-axis alignment unit is not usually the same wavelength as the exposure wavelength used to produce the chemical reaction with the photoresist. Consequently, there is often a discrepancy between alignment readings of the alignment system and exposure system. Such discrepancies are increasing as semiconductor features continue to get smaller with new generations of technology. In particular, smaller exposure wavelengths used to produce smaller features and the need for more accurate alignment has increased with smaller features, rendering on-axis alignment systems inadequate for some processes.

One alignment technique which employs wavelengths closer to and, in some embodiments, the same wavelength used in exposure units propagates light to find and correlate the position of wafer alignment marks and wafer stage marks. The propagation of light is not through the projection lens and, therefore, is often referred to as "off-axis" alignment. A greater broad band of light can be used with off-axis alignment systems and, as a benefit, such systems generally have a greater capability of detecting wafer marks within different film thicknesses. Until recently, photolithography tools employing on-axis alignment (hereinafter referred to as on-axis photolithography tools) were sufficient to align reticles to wafers and, therefore, were the most commonly used tools within the industry. As feature sizes within semiconductor devices continue to decrease, however, the use of photolithography tools employing off-axis alignment (hereinafter referred to as off-axis photolithography tools) is becoming more prevalent. Since sizes of semiconductor features differ within an integrated circuit, some fabrication facilities utilize both on-axis and off-axis photolithography tools in order to evade costs of converting all photolithography tools to off-axis systems.

Regardless of the type of alignment process used, alignment marks need to be visible throughout the fabrication process, either through surface topology contrast or by viewing them through transparent layers of the semiconductor topography. Maintaining visibility of alignment marks from the topside of a wafer, however, can be difficult during or after deposition of opaque layers following planarization of an underlying layer. As such, alignment marks are sometimes aligned with shadow clamps configured to cover portions of the wafer in deposition chambers and, therefore, avoid deposition of films thereon. Shadow clamps are typically fixed and, therefore, alignment marks are often configured having a similar spatial arrangement as shadow clamps. In addition, since wafers are typically positioned within deposition chambers with respect to crystal orientation markers of the semiconductor wafers, alignment marks are generally printed in the same relative arrangement to crystal orientation markers as shadow clamps. Yet an alternative approach to viewing alignment marks from the topside of a semiconductor wafer to align the wafer within a photolithography tool is to view the alignment marks from the bottom side of the wafer, obviating the need for shadow clamps.

Alignment marks in some off-axis photolithography tools, however, cannot be accessed from the underside of a semiconductor wafer due to stage movement limitations. In addition, some off-axis photolithography tools include areas which prohibit alignment mark detection above a wafer. Thus, alignment of a semiconductor wafer in an off-axis photolithography tool may be difficult or impossible in some cases, particularly in embodiments in which alignment marks are positioned within the regions which prohibit detection of alignment marks above the wafer. As such, sometimes further provisions need to be taken to insure proper alignment of a wafer in an off-axis photolithography tool. For example, additional alignment marks may be printed within areas accessible for detection by an off-axis photolithography tool. The printing of such alignment marks, however, undesirably increases the costs and process time of wafer fabrication as well as decreases the available space wafer upon which to form semiconductor devices. Moreover, the formation of additional alignment marks necessitates installation of additional shadow clamps, resulting in major interruptions to the fabrication operation to retrofit the tools.

Accordingly, there is a need for a method of aligning wafers within off-axis lithography tools without adding further alignment marks on the wafers. It would be beneficial for such a method to use alignment marks positioned with respect to locations of shadow clamps in deposition chambers. In addition, it would be advantageous for such a method to be compatible for fabrication sequences which utilize on-axis photolithography tools as well off-axis photolithography tools.

SUMMARY OF THE INVENTION

The problems outlined above may be in large part addressed by a method for arranging a semiconductor wafer within a photolithography tool and methods for processing a semiconductor wafer employing such an arrangement process. The following are mere exemplary embodiments of the methods and are not to be construed in any way to limit the subject matter of the claims.

One embodiment of the method for aligning a semiconductor wafer within a photolithography tool includes arranging the semiconductor wafer on a stage in a pre-alignment unit of the photolithography tool such that a crystal orientation marker of the semiconductor wafer is located at a first radial position. Thereafter, the method includes moving the semiconductor wafer from the pre-alignment unit to an exposure unit of the photolithography tool. During one or both of such steps, the method includes rotating the semiconductor wafer within a plane of its surface such that the crystal orientation marker is relocated to a second radial position prior to arranging the semiconductor wafer upon a stage of the exposure unit. In particular, the method includes rotating the semiconductor wafer greater than approximately 10° and less than approximately 170° relative to the first radial position.

An embodiment of the method for processing a semiconductor wafer includes positioning the semiconductor wafer in a pre-alignment unit of a photolithography tool, moving the semiconductor wafer from the pre-alignment unit to an exposure unit of the photolithography tool, and rotating the semiconductor wafer with respect to its position in the pre-alignment unit prior to arranging the semiconductor wafer upon a stage of the exposure unit. The method further includes imaging alignment marks from a patterned mask plate arranged within the exposure unit upon the semiconductor wafer and subsequently positioning the semiconductor wafer within a deposition chamber relative to a crystal orientation marker of the semiconductor topography. The alignment marks are imaged at locations within the semiconductor wafer relative to the crystal orientation marker and corresponding to respective positions of fixed shadow clamps within the deposition chamber such that the step of positioning the semiconductor wafer within the deposition chamber includes aligning the alignment marks with the fixed shadow clamps. Subsequent to depositing a material upon the semiconductor wafer in the deposition chamber, the method includes repeating the steps of arranging, moving and rotating the semiconductor wafer for a subsequent lithography process step in either the same photolithography tool or a different photolithography tool.

Another embodiment of the method for processing a semiconductor wafer includes printing first and second alignment marks at positions within the semiconductor wafer relative to a crystal orientation marker of the semiconductor wafer and corresponding to respective positions of shadow clamps within a deposition chamber used to process the semiconductor wafer. In addition, the method includes positioning the semiconductor wafer within the deposition chamber such that the first and second alignment marks are aligned with the shadow clamps. Subsequent to depositing a material upon the semiconductor wafer in the deposition chamber, the method includes transferring the semiconductor wafer to an off-axis alignment photolithography tool having an exposure unit with regions which are inaccessible for detecting substrate alignment marks. In order to accommodate such a configuration, the method further includes rotating the semiconductor wafer within the off-axis alignment photolithography tool such that the first and second alignment marks are accessible for detection within the exposure unit.

BRIEF DESCRIPTION OF THE DRAWINGS

These and various other features and advantages of the present invention will be apparent upon reading of the following detailed description in conjunction with the accompanying drawings and the appended claims provided below, where:

FIG. 1 is a schematic view of a method for arranging a semiconductor wafer within a photolithography tool; and FIG. 2 is a flowchart outlining an exemplary method for processing a semiconductor topography.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, an exemplary method for arranging a semiconductor wafer within a photolithography tool is illustrated schematically in FIG. 1. In particular, FIG. 1 illustrates the positioning and movement of semiconductor wafer 14 from pre-alignment unit 12 to exposure unit 22 within photolithography tool 10. As shown in FIG. 1, semiconductor wafer 14 includes crystal orientation marker 16. In general, crystal orientation marker 16 may be a visual indicator of the major crystal plane within semiconductor wafer 14 and, therefore, may be a guide for the direction of the wafer to be oriented for fabrication. In some embodiments, crystal orientation marker 16 may be a notch as shown in FIG. 1. In other embodiments, however, crystal orientation marker 16 may be a flat edge along semiconductor wafer 14. In either case, photolithography tool 10 may be programmed to position crystal orientation marker 16 in a predetermined first radial position in pre-alignment unit 12. In particular, the stage upon which semiconductor wafer 14 is received within pre-alignment unit 12 may be configured to rotate crystal orientation marker 16 to the predetermined position. In addition or alternatively, a transfer arm used to deliver semiconductor wafer 14 to pre-alignment unit 12 may be configured to rotate crystal orientation marker 16 to the predetermined position prior to placing the wafer upon the stage of the pre-alignment unit.

In some cases, pre-alignment unit 12 may be additionally configured to position crystal orientation marker 16 in a predetermined first radial position based upon detection of alignment marks 18. As will be described in more detail below, however, semiconductor wafer 14 may not always include alignment marks 18 upon entering pre-alignment unit 12. In particular, alignment marks 18 may be printed using exposure unit 22 and, therefore, in such an embodiment as well as during subsequent lithography processes, photolithography tool 10 may position semiconductor wafer 14 within pre-alignment unit 12 based on detection of crystal orientation marker 16. Furthermore, although FIG. 1 illustrates such a position at the lowermost point in the plan view of semiconductor wafer 14, the first radial position may be set at any radial position of within the surface plane of the wafer, depending on the programming instructions of photolithography tool 10 and the design specifications of devices fabricated from semiconductor wafer 14.

In some embodiments, off-axis photolithography tools may be programmed to position semiconductor wafers at a first radial position in a pre-alignment unit corresponding to a region in an adjacent exposure unit that prohibits the detection of alignment marks. An example of such a region is shown cross-hatched in FIG. 1 as region 24 in exposure unit 22. Exemplary off-axis photolithography tools having such a region include ASML 8x0 and 1100 series microlithography systems, commercially available from ASM Lithography B.V. Corporation, of Veldhoven Netherlands. In general, region 24 may differ in size, shape and/or location relative to the stage supporting semiconductor wafer 14 in exposure unit 22 in different off-axis photolithography tools and, therefore, region 24 is not necessarily limited to the areal dimensions or location shown in FIG. 1. Furthermore, it is noted that region 24 does not mask semiconductor wafer 14 during exposure and, therefore, should not be inferred to limit the area upon semiconductor wafer 14 which may be used to exposure images from a patterned mask plate in exposure unit 22.

Although photolithography tool 10 is shown having an inaccessible region for alignment mark detection in exposure unit 22, the methods described herein are not necessarily limited for use in photolithography tools with such a feature. In particular, the methods described herein may be used in any photolithography tools, including but not limited to off-axis photolithography tools with or without regions such as region 24 as well as on-axis photolithography tools. In fact, as described in more detail below, the method described in reference to FIG. 1 may be incorporated within fabrication sequences using both off-axis photolithography tools and on-axis photolithography tools.

As shown by arrow 20 in FIG. 1, semiconductor wafer 14 may be moved to exposure unit 22 subsequent to being aligned in the first radial position in pre-alignment unit 12. Prior to and/or during such a transfer process, semiconductor wafer 14 may be rotated within the surface plane of the wafer such that crystal orientation marker 16 is relocated to a second radial position prior to being placed upon a stage in exposure unit 22. In some embodiments, moving and rotating semiconductor wafer 14 may be conducted simultaneously. In other embodiments, semiconductor wafer 14 may be rotated within pre-alignment unit 12 prior to being transferred or may be rotated during intermediary phases in the transfer process during which the wafer is not moving toward exposure unit 22.

Although the degree of rotation may depend on the design specifications of the ensuing device and the size of region 24 when included in exposure unit 22 as noted below, the rotation process may generally include rotating semiconductor wafer 14 greater than approximately 10° and less than approximately 170° relative to the first radial position of crystal orientation marker 16 in pre-alignment unit 12. In other cases, the rotation process may include rotating semiconductor wafer 14 greater than approximately 45° and less than approximately 135° or, more specifically, greater than approximately 60° and less than 120°. An exemplary rotation of 900 is shown in FIG. 1 at angle 26 interposed between arrows indicating the transition between the first radial position and the second radial position of crystal orientation marker 16. Although the rotation of semiconductor wafer 14 is shown as clockwise in FIG. 1, the rotation process may alternatively be conducted counterclockwise.

In embodiments in which photolithography tool 10 is an off-axis system having region 24 inaccessible for alignment mark detection and semiconductor wafer 14 includes alignment marks 18, the rotation of semiconductor wafer 14 may be sufficient such that the alignment marks are not under region 24 as shown in FIG. 1. In other words, semiconductor wafer 14 may be rotated such that alignment marks 18 are accessible for detection within exposure unit 22. In this manner, both of alignment marks 18 may be used to refine the position of semiconductor wafer 14 for proper alignment with a patterned mask plate included in exposure unit 22. In particular, a laser beam may be directed at alignment marks 18 and reflected to sensing devices within exposure unit 22 to detect the precise position of the alignment marks. Alignment is achieved by moving the patterned mask plate and/or the stage upon which semiconductor wafer 14 is arranged until alignment guides in the patterned mask plate are correctly positioned with respect to alignment marks 18. Although the stage in exposure unit 22 may be moved laterally or rotationally for the alignment process, the rotational movement of the stage is typically limited to only a few degrees, particularly in off-axis photolithography tools having regions which are inaccessible for alignment mark detection. Due to such a constraint, moving the stage within exposure unit 22 such that alignment marks 18 are moved out from under region 24, and therefore are accessible, is not generally feasible.

As noted above, semiconductor wafer 14 may not, in some embodiments, include alignment marks 18 upon entering photolithography tool 10. As such, in some embodiments, semiconductor wafer 14 may not be aligned relative to the alignment guides of a patterned mask plate in exposure unit 22. Rather, semiconductor wafer 14 may be positioned within exposure unit 22 as received. In such cases, alignment marks 18 may be imaged upon semiconductor wafer 14 for alignment in subsequent lithographic processes. In general, imaging alignment marks 18 may involve transferring an optical image from a patterned mask plate to a photoresist formed upon semiconductor wafer 14 and subsequently etching within exposed regions of the wafer outlined by the patterned photoresist. In some embodiments, alignment marks 18 may be formed within the substrate material of semiconductor wafer 14, including but not limited to monocrystalline silicon and silicon-germanium substrates. In other embodiments, alignment marks may be formed within one or more layers arranged above the substrate material of the wafer. In either case, alignment marks 18 may be formed to any shape. As such, although alignment marks 18 are shown as a "+" mark in FIG. 1, the methods described herein are not so limited. Furthermore, any number of alignment marks 18 may be fabricated within semiconductor wafer 14 and at any size. In some embodiments, however, it may be advantageous to limit the number of alignment marks 18 to two and/or limit the size to a minimal detectable range in order maximize the amount of space on semiconductor wafer 14 to fabricate devices.

Moreover, alignment marks 18 may be formed at any locations within semiconductor wafer 14. For example, in some embodiments, one of alignment marks 18 may be formed near crystal orientation marker 16 and another alignment mark may be formed near a crown of semiconductor wafer 14 as shown in FIG. 1. The crown of a semiconductor wafer may be referred to herein as an edge portion of the wafer directly opposite from the crystal orientation marker. The positions of alignment marks 18, however, are not necessarily limited to the illustration of FIG. 1. In particular, alignment marks 18 may be additionally or alternatively arranged along other edge portions of the wafer and/or may be arranged somewhere in between the edge and center of the wafer, including but not limited to scribe lines within semiconductor wafer 14. Moreover, alignment marks 18 do not necessarily need to be positioned in opposite regions of semiconductor wafer 14 as shown in FIG. 1. Rather, alignment marks may be positioned in any relation to each other on semiconductor wafer 14. It is noted that although the formation of alignment marks 18 is discussed in reference to an embodiment in which semiconductor wafer 14 is rotated prior to be being placed on a stage of exposure unit 22, alignment marks 18 may alternatively be formed upon semiconductor wafer 14 without the rotation process since the alignment marks are not used to align the wafer during such a process. Such an alternative embodiment is described in more detail below in reference to block 30 in FIG. 2.

In some embodiments, it may be advantageous to print alignment marks at a similar spatial arrangement as shadow clamps included within deposition chambers used to subsequently process a semiconductor wafer, particularly deposition chambers configured to deposit opaque materials. As noted above, some deposition chambers have fixed shadow clamps which protect portions of an underlying wafer from deposition. As such, it may be advantageous to align alignment marks 18 with the shadow clamps to avoid deposition thereon. In some marker 16 and near the crown of the wafer as shown in FIG. 1 may be advantageous in some embodiments. Deposition chambers, however, may have shadow clamps fixed at locations corresponding to other positions of a wafer in some embodiments and, therefore, alignment marks 18 are not necessarily limited to the positions shown in FIG. 1.

In other cases, alignment marks 18 may be arranged at a similar spatial arrangement as deposition chamber shadow clamps, but not at the same respective locations relative to crystal orientation marker 16 of semiconductor wafer 14. In such cases, an alternative approach for avoiding the deposition of material on alignment marks includes rotating the wafer inside the deposition tool such that shadow clamps are positioned over the alignment marks. Many deposition tools, however, do not have rotational capability, making such an approach difficult to implement. In other cases, alignment marks 18 may not be positioned at a similar spatial arrangement as deposition chamber shadow clamps. In such embodiments, alternative provisions may need to be taken to insure alignment marks are viewable within semiconductor wafer 14. For example, additional photolithography and etch steps may be conducted to remove material deposited within alignment marks as necessary. Such extra processes, however, increase the load on production tools, impacting the wafer cost and cycle time. For example, removing the material from an alignment mark may add six extra process steps to a process flow.

It is noted that the deposition of material over alignment marks 18 does not necessarily need to be avoided or removed for all deposition processes of semiconductor wafer 14. In particular, transparent films may be deposited over alignment marks 18 since the marks can be viewed through such materials. Even the deposition of opaque materials, such as metal materials, over alignment marks 18 may be acceptable in some embodiments if the step height of the alignment mark is replicated in those materials. However, in embodiments in which an opaque layer is planarized or a layer deposited over an opaque layer is planarized, the deposition of the opaque layer over alignment marks 18 generally needs to be avoided or removed.

As will be described in more detail below, the method described in reference to FIG. 1 may be conducted for all photolithography processes used to image die pattern portions on semiconductor wafer 14. In particular, the steps of aligning semiconductor wafer 14 within a pre-alignment unit, transferring the wafer to an exposure unit, and rotating the wafer prior to placing it on a stage of the exposure unit may be conducted for each lithography process of a fabrication sequence for semiconductor wafer 14. In such cases, semiconductor wafer 14 is preferably rotated the same direction and the same amount relative to a position in pre-alignment unit 12 such that the crystal orientation marker of the wafer is positioned at the same radial position in exposure unit 22 for all subsequent lithography process steps. In this manner, successive layers formed on semiconductor wafer 14 may be correctly aligned per the design specifications of the ensuing device.

As noted above, the methods described herein may be used with but are not limited to off-axis photolithography tools and on-axis photolithography tools. Off-axis photolithography tools advantageously find and correlate the position of wafer alignment marks and wafer stage marks rather than correlating the marks on the reticle to wafer alignment marks. The propagation of light is not restricted to the projection lens and, therefore, a greater broad band of light can be used as compared to, for example, on-axis alignment systems. In addition, off-axis photolithography tools include an anti-reflection point, allowing a greater range of wavelengths to be used to look for alignment marks. As such, in some embodiments, it may be advantageous to implement the method described in reference to FIG. 1 for a fabrication sequence including a lithography process using an off-axis photolithography tool. As noted above, however, some fabrication facilities utilize both on-axis and off-axis photolithography tools in order to evade costs of converting all photolithography tools to off-axis systems. As such, in some embodiments, the method described in reference to FIG. 1 may be used with photolithography tools of different alignment systems for a fabrication sequence of semiconductor wafer 14. Alternatively, the method may be used with photolithography tools of the same type of alignment system for a fabrication sequence of semiconductor wafer 14.

In some embodiments, the imaging of all die pattern portions may be conducted subsequent to printing the alignment marks and further subsequent to the deposition of layers on the wafer. In other embodiments, however, some die pattern portions may be imaged at a time in which a wafer is in an exposure unit for imaging alignment marks. In such cases, the die pattern portions and the alignment marks may be imaged in a different relative orientation than included in the patterned mask plate. In particular, since the wafer is rotated prior to being placed on the stage of the exposure unit, the position of the alignment marks within the patterned mask plate may be altered from their desired location on the wafer. In order to image the alignment marks in the desired location, portions of the patterned mask plate other than the alignment marks to be imaged may be obstructed (which is commonly referred to in the semiconductor fabrication industry as "blading") and the exposure stage may be laterally moved to position the wafer in the appropriate location to image the alignment marks. Prior or subsequent thereto, die pattern portions of the patterned mask plate may be imaged on to the semiconductor wafer by blading the alignment marks. After imaging the die pattern portions and the alignment marks, all exposed regions of the wafer outlined by the imaged photoresist may be etched to pattern the semiconductor topography.

A method for processing a semiconductor wafer is outlined in a flowchart in FIG. 2 including the process described above in reference to FIG. 1 for arranging a wafer within a lithography tool. As shown in FIG. 2, the method may include block 30 in which alignment marks are printed at positions within the semiconductor wafer relative to a crystal orientation marker of the semiconductor wafer and corresponding to respective positions of shadow clamps within a deposition chamber used to process the semiconductor wafer. Such a process is described above in reference to the discussion of printing alignment marks 18 upon semiconductor wafer 14. As described in reference to FIG. 1, the semiconductor wafer may be rotated prior to being placed upon an exposure unit of the photolithography tool in some embodiments. In such cases, die pattern portions may be imaged on the semiconductor topography imaged at a time in which a wafer is in an exposure unit for imaging alignment marks. As described above, the die pattern portions and alignment marks, in such a case, may be imaged in a different relative orientation upon the semiconductor wafer than included in the patterned mask plate.

In other embodiments, the semiconductor wafer may not be rotated prior to being transferred to the exposure unit. In such cases, the alignment marks may be imaged relative to the crystal orientation marker of the semiconductor wafer and, therefore, may be imaged corresponding to respective positions of shadow clamps within a deposition chamber, regardless of whether the wafer is rotated. In particular, alignment marks may be printed near the crystal orientation marker and the crown of a wafer, for example, regardless of whether the wafer is rotated for such imaging. Die pattern portions, however, may not be imaged at such a time since subsequent lithography processes will include rotating the wafer prior to the wafer being placed on a stage of the exposure unit. Since the alignment marks were imaged at the desired locations relative to the crystal orientation marker and the crown of a wafer, they will be rotated to desired positions for alignment of the wafer during such subsequent lithography processes.

The method further includes block 32 in which the semiconductor wafer is positioned within the deposition chamber such that the printed alignment marks are aligned with the shadow clamps of the chamber. As noted above, positioning a semiconductor wafer within a deposition chamber may be conducted relative to the crystal orientation marker of the wafer. Since the alignment marks are printed at locations of a wafer corresponding to respective positions of shadow clamps to the crystal orientation marker of the wafer, the alignment marks of the wafer will automatically align with the shadow clamps without any modifications to the structure or use of the deposition chamber. As shown in block 34 of FIG. 2, the method includes transferring the semiconductor wafer to a pre-alignment unit of a photolithography tool subsequent to the deposition of a film on the wafer. Such a process may be similar to the process described above in reference to the alignment of semiconductor wafer 14 within pre-alignment unit 12. In some embodiments, the photolithography tool may be the same photolithography tool used to print the alignment marks noted in block 30. In other embodiments, however, different photolithography tools may be used for the processes of block 30 and block 34. In such cases, the photolithography tools may include the same or different types of alignment systems, including but not limited to off-axis alignment and on-axis alignment systems.

In any case, the method includes block 36 in which the semiconductor wafer is rotated with respect to its position in the pre-alignment unit prior to arranging the semiconductor wafer upon a stage of an exposure unit of the photolithography tool. As described in the process illustrated in FIG. 1, the rotation of the semiconductor wafer may be conducted prior to and/or during the transfer of the wafer from the pre-alignment unit to the exposure unit. Subsequent to the alignment marks on the wafer being aligned with a patterned mask plate within the exposure unit, die pattern portions may be imaged on to the semiconductor wafer to pattern the deposited material. As shown in block 38, the step of rotating the wafer within the photolithography tool is then repeated in subsequent lithography process steps, and preferably rotated such that the crystal orientation marker of the wafer is positioned at the same radial position for all subsequent lithography process steps. In other words, the wafer is preferably rotated the substantially equal amount relative to a position in the pre-alignment unit. In this manner, successive layers upon a semiconductor wafer may be patterned in alignment.

The advantages of the methods described herein include: (i) the ability to integrate off-axis photolithography tools with the same reticles used in process flows prior to using the off-axis photolithography tools; (ii) maximum flexibility enabling the utilization of both old and new photolithography tools within a process flow; and (iii) avoiding or eliminating the need for additional alignment marks (occupying more wafer area) and/or additional process steps for clearing those alignment marks, thereby reducing both short term and long term costs of incorporating off-axis photolithography tools within a fabrication sequence.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A method for processing a semiconductor wafer, comprising:
    positioning the semiconductor wafer in a pre-alignment unit of a first photolithography tool;
    moving the semiconductor wafer from the pre-alignment unit to an exposure unit of the first photolithography tool;

rotating the semiconductor wafer with respect to its position in the pre-alignment unit prior to arranging the semiconductor wafer upon a stage of the exposure unit;

imaging alignment marks from a patterned mask plate arranged within the exposure unit upon the semiconductor wafer;

positioning the semiconductor wafer within a deposition chamber relative to a crystal orientation marker of the semiconductor topography subsequent to the step of imaging the alignment marks, wherein the step of imaging the alignment marks comprises imaging the alignment marks at locations within the semiconductor wafer relative to the crystal orientation marker and corresponding to respective positions of fixed shadow clamps within the deposition chamber such that the step of positioning the semiconductor wafer within the deposition chamber comprises aligning the alignment marks with the fixed shadow clamps; and repeating the steps of arranging, moving and rotating the semiconductor wafer within a second photolithography tool for a subsequent lithography process step after depositing a material upon the semiconductor wafer in the deposition chamber.

2. The method of claim 1, wherein the step of rotating the semiconductor wafer comprises rotating the semiconductor wafer greater than approximately 10° and less than approximately 170°.

3. The method of claim 1, wherein the first and second photolithography tools are the same photolithography tools.

4. The method of claim 1, wherein the first and second photolithography tools are different photolithography tools.

5. The method of claim 1, further comprising repeating the steps of arranging, moving and rotating the semiconductor wafer for all subsequent lithography process steps used to process the semiconductor wafer.

6. The method of claim 1, further comprising imaging die pattern portions upon the semiconductor wafer prior to the step of positioning the semiconductor wafer within the deposition chamber, wherein the steps of imaging the die pattern portions and imaging the alignment marks comprise imaging the die pattern portions and the alignment marks in a different relative orientation upon the semiconductor wafer than included in the patterned mask plate.

7. A method for processing a semiconductor wafer, comprising:

printing first and second alignment marks at positions within the semiconductor wafer relative to a crystal orientation marker of the semiconductor wafer and corresponding to respective positions of shadow clamps within a deposition chamber used to process the semiconductor wafer;

positioning the semiconductor wafer within the deposition chamber such that the first and second alignment marks are aligned with the shadow clamps;

transferring the semiconductor wafer to an off-axis alignment photolithography tool subsequent to depositing a material upon the semiconductor wafer in the deposition chamber, wherein the off-axis alignment photolithography tool comprises an exposure unit having regions which are inaccessible for detecting substrate alignment marks; and rotating the semiconductor wafer within the off-axis alignment photolithography tool such that the first and second alignment marks are accessible for detection within the exposure unit.

8. The method of claim 7, wherein the step of rotating the semiconductor wafer comprises rotating the semiconductor wafer greater than approximately 10° and less than approximately 170° with respect to its position in a pre-alignment unit of the off-axis photolithography tool prior to arranging the semiconductor wafer upon a stage of the exposure unit.

9. The method of claim 7, further comprising:

positioning the semiconductor wafer within a different deposition chamber such that the first and second alignment marks are aligned with shadow clamps of the different deposition chamber;

transferring the semiconductor wafer to an on-axis alignment photolithography tool subsequent to depositing a material upon the semiconductor wafer in the different deposition chamber; and rotating the semiconductor wafer within the on-axis alignment photolithography tool, wherein the steps of rotating the semiconductor wafer within the on-axis alignment photolithography tool and rotating the semiconductor wafer within the off-axis alignment photolithography tool comprise rotating the semiconductor wafer a substantially equal amount.

10. The method of claim 9, wherein the steps of transferring and rotating the semiconductor wafer within an on-axis alignment photolithography tool is conducted prior to the steps of transferring and rotating the semiconductor wafer within an off-axis alignment photolithography tool.

11. The method of claim 9, wherein the steps of transferring and rotating the semiconductor wafer within an on-axis alignment photolithography tool is conducted subsequent to the steps of transferring and rotating the semiconductor wafer within an off-axis alignment photolithography tool.

* * * * *